US008519815B1

(12) United States Patent
Sanders

(10) Patent No.: US 8,519,815 B1
(45) Date of Patent: Aug. 27, 2013

(54) MULTI-LAYERED CIRCUIT STRUCTURE

(75) Inventor: Gary L. Sanders, Vancouver, WA (US)

(73) Assignee: TiVo Inc., Alviso, CA (US)

( * ) Notice: Subject to any disclaimer, the term of this patent is extended or adjusted under 35 U.S.C. 154(b) by 0 days.

(21) Appl. No.: 13/196,739

(22) Filed: Aug. 2, 2011

Related U.S. Application Data

(63) Continuation-in-part of application No. 12/961,959, filed on Dec. 7, 2010, now Pat. No. 8,421,575.

(51) Int. Cl.
  *H01F 5/00* (2006.01)
  *H01F 27/28* (2006.01)

(52) U.S. Cl.
  USPC .......................... 336/200; 336/223; 336/232

(58) Field of Classification Search
  USPC ............. 336/147, 180, 200, 223, 232, 186, 336/187; 333/26, 185, 25, 131, 161, 172, 333/177
  See application file for complete search history.

(56) References Cited

U.S. PATENT DOCUMENTS

| 6,380,727 | B1 * | 4/2002 | Jitaru .......................... 324/117 R |
| 6,483,400 | B1 | 11/2002 | Phillips, Jr. |
| 6,515,556 | B1 * | 2/2003 | Kato et al. ..................... 333/116 |
| 7,176,776 | B1 * | 2/2007 | Tantwai et al. ................ 336/200 |
| 7,248,138 | B2 * | 7/2007 | Chiang et al. .................. 336/200 |
| 7,317,354 | B2 * | 1/2008 | Lee ................................ 330/200 |
| 7,864,021 | B2 * | 1/2011 | Matsushita et al. ........... 336/222 |
| 2004/0108935 | A1 | 6/2004 | Kyriazidou |
| 2005/0212640 | A1 | 9/2005 | Chiang et al. |
| 2006/0125589 | A1 | 6/2006 | Tamata et al. |
| 2006/0284719 | A1 | 12/2006 | Lee |
| 2007/0126544 | A1 * | 6/2007 | Wotherspoon et al. ........ 336/200 |
| 2008/0180206 | A1 * | 7/2008 | Fouquet et al. ................ 336/200 |
| 2008/0197963 | A1 | 8/2008 | Muto |
| 2008/0303622 | A1 | 12/2008 | Park et al. |
| 2010/0295652 | A1 * | 11/2010 | Mori .............................. 336/232 |

OTHER PUBLICATIONS

Wikpedia, the Free Encyclopedia entitled "Inductor" dated Oct. 18, 2010 (12 pages), http://en.wikipedia.org/wiki/Inductor.
Wikpedia, the Free Encyclopedia entitled "Magnetic Core" dated Oct. 18, 2010 (8 pages), http://en.wikipedia.org/wiki/Magnetic_core.
U.S. Appl. No. 12/961,959, filed Dec. 7, 2010, Advisory Action, Mailing Date Aug. 14, 2012.

\* cited by examiner

*Primary Examiner* — Mohamad Musleh
*Assistant Examiner* — Mangtin Lian
(74) *Attorney, Agent, or Firm* — Hickman Palermo Truong Becker Bingham Wong LLP

(57) ABSTRACT

An enhanced multi-layered structure is disclosed including an N number of inductor layers (N is an integer greater than one). Each inductor layer includes a substrate and at least one spiral inductors situated on the substrate. The inductor layers may be stacked and aligned with each other so that the electromagnetic fields of the spiral inductors on different inductor layers overlap (at least partially). The spiral inductors on the various inductor layers may be electrically coupled to each other so as to act at an overall inductor. The substrates may be very thin to reduce losses, increase the inductance, and lower the resistance of the overall inductor. The enhanced structure may further include ground planes disposed on top of and below the N inductor layers to provide shielding for the inductor layers. This enhanced structure enables a low loss, high Q inductor to be implemented in a high-performance circuit.

23 Claims, 10 Drawing Sheets

MULTI-LAYERED CIRCUIT STRUCTURE

PRIORITY CLAIM

This application is a continuation-in-part of U.S. application Ser. No. 12/961,959, entitled MULTI LAYERED CIRCUIT STRUCTURE, filed on Dec. 7, 2010 now U.S. Pat. No. 8,421,575. The entire contents of the prior application are incorporated by reference herein.

BACKGROUND

Inductors are used in many of today's signal processing circuits. For example, in diplexer and triplexer circuits, inductors and capacitors are used to implement the signal filters that are part of the diplexers and triplexers.

Typically, when an inductor is implemented in a circuit, a discreet inductor component is used. Generally, there are two types of discrete inductors. A first type is a fixed-value sealed inductor in which the inductance value of the inductor is fixed (i.e. not adjustable). This type of inductor is commonly implemented as a coil or winding of wire around a core, which may be made of various types of material. Due to manufacturing variations, material variations, etc., the best achievable tolerance for this type of discrete inductor is approximately 2%. This means that the inductance value of an inductor of this type can be precise to within 2% of a target inductance value (thus, the actual inductance of the inductor may be exactly the target inductance value or it may be up to 2% off of the target inductance value). This relative lack of precision may render the fixed-value inductor unusable in some applications. The other type of discrete inductor is a variable inductor, which has windings that are slightly spread open so that they can be adjusted. By spreading the windings, the inductance can be decreased. Conversely, by compressing the windings, the inductance can be increased. Because this type of inductor can be adjusted, a very precise inductance value can be achieved. However, because the windings require manual adjustment, the process of achieving the desired inductance value can be quite labor intensive.

Diplexer and triplexer circuits usually require sharp-cutoff signal filters that can change their amplitude response very quickly as frequency changes. For this type of signal filter, inductors with very precise inductance values are needed. Because of their lack of precision, fixed-value discrete inductors are typically not suitable for diplexers and triplexers. As a result, most diplexers and triplexers are implemented with variable inductors. As noted above, however, discrete variable inductors require manual adjustment, which can be quite labor intensive. This labor slows down the manufacturing process and significantly increases the cost of the final product.

Another drawback to the use of discreet inductors (either the fixed-value type or the variable type) is that they tend to require significant amounts of space. With devices becoming ever smaller, space is a precious commodity that needs to be conserved whenever possible. Thus, anything that requires large amounts of space is generally disfavored.

Given the drawbacks of using discreet inductors, an improved technique for implementing an inductor in a circuit is needed.

DETAILED DESCRIPTION OF EMBODIMENT(S)

In accordance with one embodiment of the present invention, there is provided a multi-layered structure for implementing an inductor. With this multi-layered structure, it is possible to implement an inductor in a circuit without using a discreet inductor.

Spiral Inductor

Figure 1:
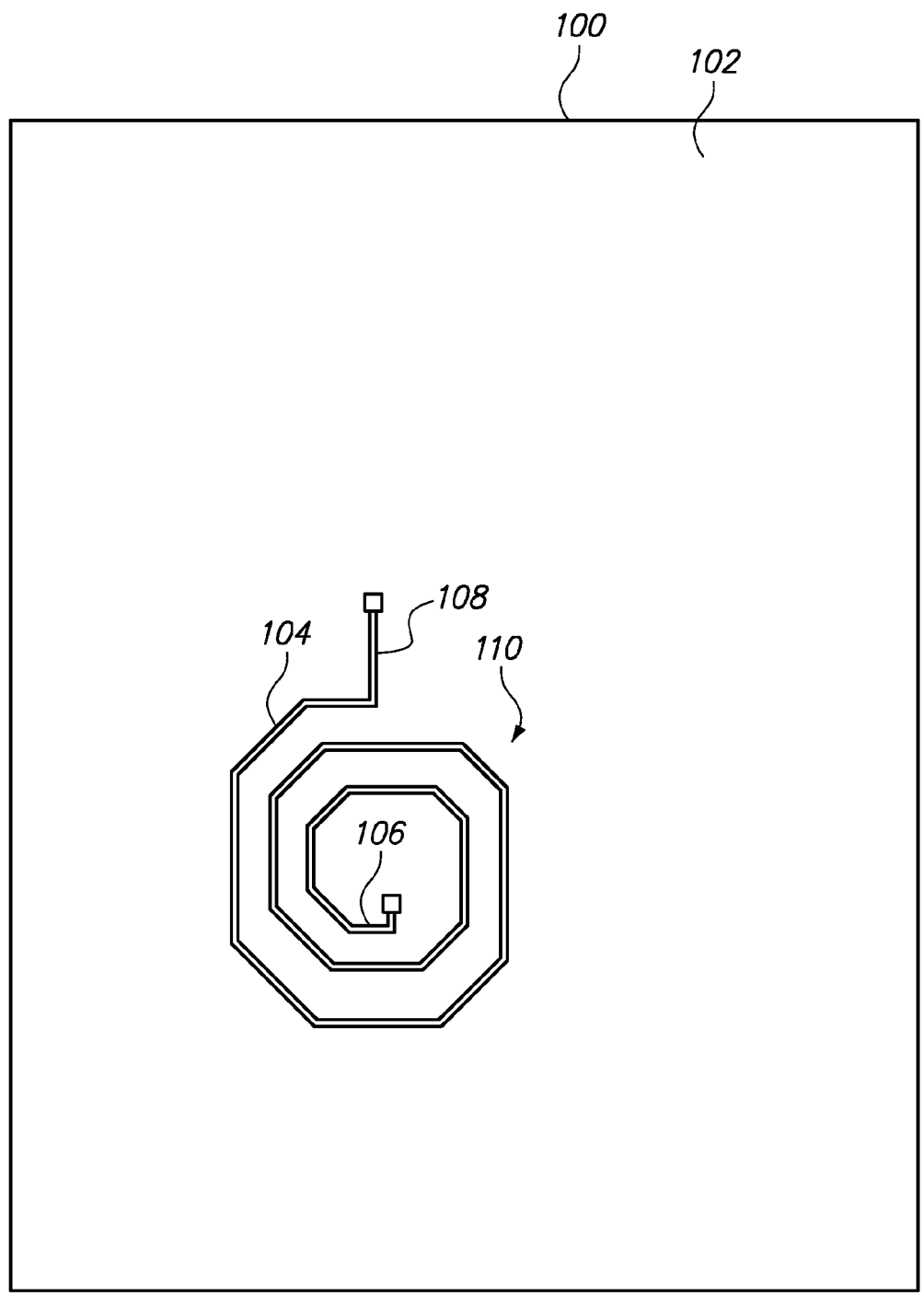
FIG. 1 shows a first spiral inductor situated on a surface of a first planar substrate layer, in accordance with one embodiment of the present invention.

In one embodiment, a spiral inductor is used to produce the inductance of the multi-layered structure. A sample spiral inductor is shown in FIG. 1. In one embodiment, the spiral inductor is formed by a line or strip 104 of conductive material having a certain width that winds outwardly from and around a center in such a way that a spiral 110 is formed. The spiral 110 has a center portion 106 and a tail portion 108. Because of its winding nature, the spiral 110 is similar to a coil; thus, when electricity is flowed through the line 104 of conductive material, an electromagnetic field is created, and an inductance is exhibited. Hence, the line 104 of conductive material behaves like an inductor. In the spiral inductor of FIG. 1, the center portion 106 and the tail portion 108 of the spiral 110 represent the two terminals of the inductor.

In one embodiment, the line 104 of conductive material is situated on a surface 102 of a planar substrate layer 100. For purposes of the present invention, the substrate layer 100 may be made of various types of material (e.g. dielectric material, which is typical of a printed circuit board (pcb), silicon, or any other material suitable for electronic circuits), and the line 104 may be composed of any desired conductive material (e.g. copper, etc.). The line 104 may be situated on the substrate layer 100 using any desired method (e.g. etching, depositing, etc.). The width and thickness of the line 104, and the geometry (e.g. shape, dimensions, number of windings, etc.) of the spiral 110 may be adjusted to achieve various desired inductance values for the spiral inductor. An advantage of a spiral inductor over a discrete inductor is that, once it is designed and its dimensions are determined, the inductance of the spiral inductor does not vary much in the manufacturing process. Thus, a spiral inductor has very low tolerance levels (e.g. as low as 0.25%). Accordingly, very precise inductance values can be achieved with a spiral inductor.

Multiple Layers of Spiral Inductors

It has been observed by Applicant that a spiral inductor, implemented on a single substrate layer, sometimes does not exhibit a high enough quality factor value (referred to as the Q factor of an inductor) to be used in certain applications. For example, a single spiral inductor often does not have a high enough Q factor value to be used in a diplexer design requiring a sharp cutoff.

One of the reasons that a spiral inductor may not exhibit a high Q factor value is that it suffers from skin-effect losses. These skin-effect losses emanate from the two parallel conductive surfaces of the spiral inductor: (1) the bottom surface of the spiral inductor that contacts the surface 102 of the substrate layer 100; and (2) the top surface of the spiral inductor that is exposed to air. Both of these surfaces suffer skin-effect losses, and these losses degrade the Q factor of the spiral inductor.

Figure 2:
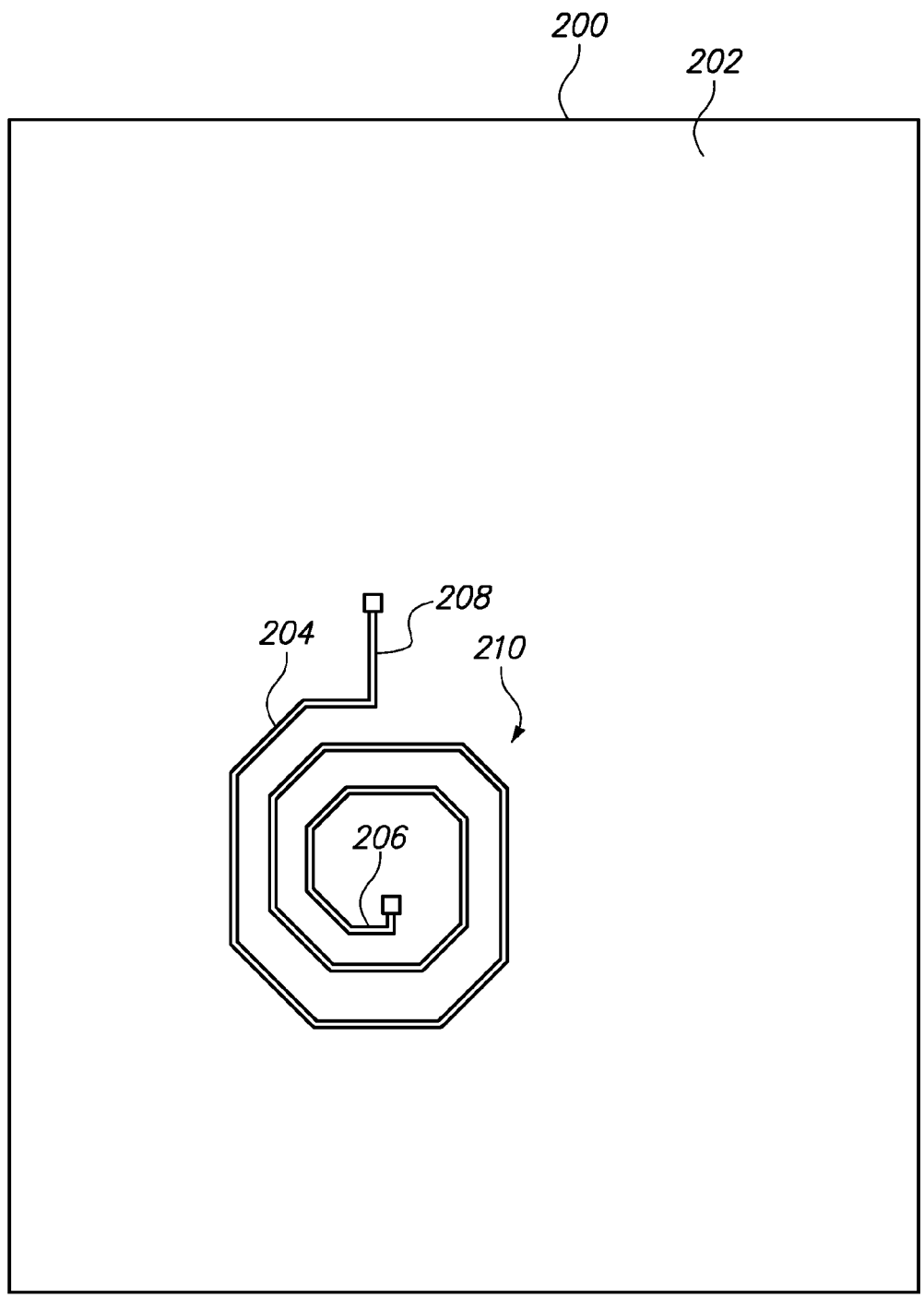
FIG. 2 shows a second spiral inductor situated on a surface of a second planar substrate layer, in accordance with one embodiment of the present invention.

It has been discovered by Applicant, however, that skin-effect losses may be reduced by implementing spiral inductors on multiple substrate layers, and aligning and coupling the spiral inductors in such a way that they form an overall inductor. By reducing the skin-effect losses, the Q factor of the overall inductor can be significantly improved. To illustrate how this may be done, reference will be made to FIG. 2, which shows a second spiral inductor situated on a surface 202 of a second substrate layer 200. Like the first spiral inductor, the second spiral inductor is formed by a line or strip 204 of conductive material that winds outwardly from and around a center in such a way that a second spiral 210 is formed. The second spiral 210 has a center portion 206 and a tail portion 208, which represent the two terminals of the second spiral inductor. For purposes of the present invention, the second substrate layer 200 may be made of various types of material (e.g. dielectric material, silicon, or any other material suitable for electronic circuits), and the line 204 may be composed of any desired conductive material (e.g. copper, etc.). The line 104 may be situated on the substrate layer 200 using any desired method (e.g. etching, depositing, etc.). In one embodiment, the second spiral 210 is geometrically similar (e.g. similar in shape, dimensions, number of windings, etc.) to the first spiral 110, such that if the first spiral 110 were placed over the second spiral 210, the first spiral 110 would substantially overlap the second spiral 210. Put another way, if the first spiral 110 were placed over the second spiral 210, the first line 104 of conductive material would substantially overlap or trace the second line 204 of conductive material.

To form an overall inductor from the separate spiral inductors, the second substrate layer 200, in one embodiment, is placed beneath the first substrate layer 100, and is situated relative to the first substrate layer 100 such that: (a) the second substrate layer 200 is substantially parallel with the first substrate layer 100; and (b) the first spiral 110 is substantially aligned with the second spiral 210. When the two substrate layers and spiral inductors are so aligned, the first spiral 110 will effectively be on top of the second spiral 210, and the first line 104 of conductive material will substantially overlap the second line 204 of conductive material. In effect, the two geometrically similar spiral inductors are placed in parallel with each other.

Figure 3:
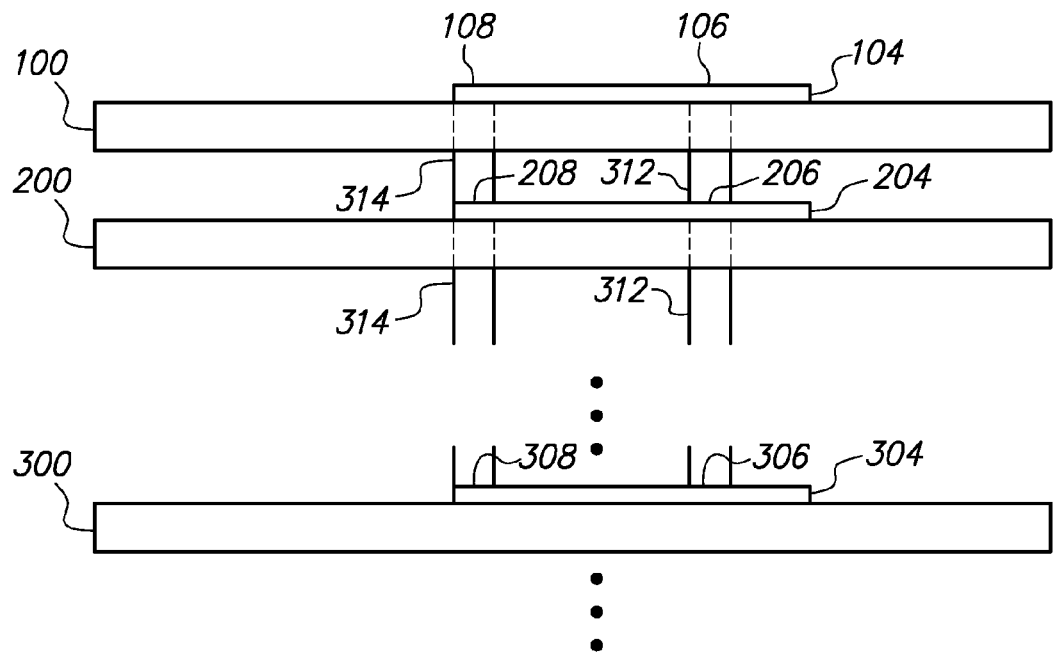
FIG. 3 shows a side view of the planar substrate layers of FIGS. 1 and 2 to illustrate how the first and second spiral inductors may be electrically coupled to form an overall multi-layered inductor, in accordance with one embodiment of the present invention.

This alignment is shown in FIG. 3, which shows a side view of the substrate layers 100 and 200 after they have been positioned in the manner described above. Notice that the substrate layers 100 and 200 are substantially parallel with each, that the center portion 106 of the first spiral inductor is substantially aligned with the center portion 206 of the second spiral inductor, and that the tail portion 108 of the first spiral inductor is substantially aligned with the tail portion 208 of the second spiral inductor. Aligned in this manner, the two spiral inductors may be electrically coupled to each other using coupling structures 312 and 314, which in one embodiment may be vias (Vertical Interconnect Access). Specifically, a first via 312 is used to electrically couple the center portion 106 of the first spiral inductor to the center portion 206 of the second spiral inductor, and a second via 314 is used to electrically couple the tail portion 108 of the first spiral inductor to the tail portion 208 of the second spiral inductor. With their center portions and tail portions electrically coupled in this manner, the first and second spiral inductors will no longer behave as separate spiral inductors but rather as a single overall inductor. The Q factor of this overall multi-layered inductor is higher than the Q factor of either of the individual spiral inductors due to reduced skin effect losses.

In the example discussed thus far, only two spiral inductors on two substrate layers are used to form the multi-layered inductor. It should be noted, however, that this concept of a multi-layered inductor may be expanded to encompass any N number of spiral inductors on N number of substrate layers (for example, N may be 2, 3, 4, 5, 6, 7, 8, or higher). In fact, with addition spiral inductors and substrate layers, higher Q factor values may be achieved for the overall multi-layered inductor. In one embodiment, the geometry of each additional spiral inductor is similar to the geometry of the spiral inductor immediately above it.

As shown in FIG. 3, an additional spiral inductor on an additional substrate layer 300 may be added to the multi-layered inductor structure by positioning the additional substrate layer 300 in such a manner that: (a) the additional substrate layer 300 is substantially parallel with the other substrate layers 100 and 200; and (b) the center portion 306 of the additional spiral inductor is substantially aligned with the center portions 106, 206 of the other spiral inductors, and the tail portion 308 of the additional spiral inductor is substantially aligned with the tail portions 108, 208 of the other spiral inductors. Positioned in this manner, the center portion 306 of the additional spiral inductor may be electrically coupled by via 312 to the center portions 106, 206 of the other spiral inductors, and the tail portion 308 of the additional spiral inductor may be electrically coupled by via 314 to the tail portions 108, 208 of the other spiral inductors. Electrically coupled in this manner, the additional spiral inductor will join with the other spiral inductors to act as a single overall inductor with an improved Q factor. In the manner described, a multi-layered inductor can be constructed.

Theoretical Underpinning

In the above description, it is asserted that the multi-layered inductor structure has an improved Q factor as compared to a single spiral inductor. To facilitate a complete understanding of the invention, the theoretical underpinning for this assertion will now be discussed.

The quality factor Q is computed based upon the following equation:

$$Q = L/R \qquad \text{Eq. 1}$$

where L is inductance and R is resistive loss. Q can be increased by increasing L, decreasing R, or both. As will be explained below, in one embodiment, the multi-layered inductor structure improves Q by keeping L substantially the same while significantly reducing R.

In the multi-layered structure described above, the tail portions of the spiral inductors on the multiple substrate layers are electrically coupled together, and the center portions of the spiral inductors on the multiple substrate layers are electrically coupled together. Thus, from a circuit connectivity standpoint, the various spiral inductors are connected in parallel.

Typically, when inductors are connected in parallel, the inductance value of the overall combination is given by the following equation:

$$1/L_t = 1/L_1 + 1/L_2 + 1/L_3 + \ldots 1/L_n \qquad \text{Eq. 2}$$

where Lt is the overall total inductance, and L1, L2, L3, and Ln are the inductances of the individual inductors. If all of the individual inductors have the same inductance L, then Eq. 2 simplifies to:

$$L_t = L/N \qquad \text{Eq. 3}$$

where N is the number of inductors that have been placed in parallel. Since N is in the denominator, the more inductors that are put in parallel, the smaller the overall inductance becomes. Thus, connecting inductors in parallel usually results in a lower overall inductance.

However, Equations 2 and 3 only hold true if the electromagnetic (EM) fields generated by the various inductors do not overlap. If the EM fields do overlap, that is, if the EM fields are not isolated from each other, then the overall inductance does not diminish as set forth in Equations 2 and 3. It has been observed by Applicant that, in the multi-layered inductor structure described above, if the spiral inductors are placed close enough to each other, and if they are properly aligned, then their EM fields will overlap and in effect reinforce each other. This will cause the overall inductance of the multiple spiral inductors to not diminish as indicated in Equations 2 and 3, despite the fact that the spiral inductors are connected in parallel. In fact, with proper design dimensions, proper layer thicknesses, proper number of layers, etc., it is possible to bring the inductance of the multiple, parallel-connected spiral inductors close to L rather than L/N (where L is the inductance of one of the spiral inductors assuming that all of the spiral inductors have substantially the same inductance L). Thus, the multiple spiral inductors can exhibit an inductance that is about the same as the inductance L of a single one of the spiral inductors. As a non-limiting example, a multi-layered inductor structure may be constructed with the following specifications: (a) three substantially identical spiral inductors, each situated on a separate substrate layer; (b) each spiral conductor has a strip width of 5 mils (where a mil is one thousandth of an inch (0.001 inch)), a spacing between windings of 5 mils, and a diameter of 50 mils; and (c) each substrate layer is 5 mils thick. With this multi-layered structure, the EM fields of the spiral inductors will substantially overlap and the spiral inductors, connected in parallel, will exhibit an inductance that is just slightly smaller than the inductance L of one of the spiral inductors.

The above discussion shows how the multi-layered inductor structure is able to maintain the inductance at about the same level as a single spiral inductor. The reduction in R will now be addressed. Skin-effect losses can be represented as a resistance that increases with frequency. Because the skin-effect resistance varies with frequency, it is shown as a function of frequency (f) in the equation below. The effective skin-effect loss of multiple parallel spiral inductors with perfectly overlapping EM fields is given by the following equation:

$$1/R_t(f) = 1/R_1(f) + 1/R_2(f) + 1/R_3(f) \qquad \text{Eq. 4}$$

where Rt is the total resistance, and R1, R2, and R3 are the resistances of the individual spiral inductors. The number of terms on the right side of the equation is equal to the number of parallel spiral inductors. If the spiral inductors are assumed to be identical, and hence, have identical resistances, then equation 4 simplifies to:

$$Rt(f) = R(f)/N \qquad \text{Eq. 5}$$

where N is the number of parallel spiral inductors. Notice that N is in the denominator; thus, the greater the number of parallel spiral inductors, the smaller the overall resistance (i.e. the smaller the skin effect losses). Hence, by connecting more spiral inductors in parallel, the R of the overall multi-layered inductor is decreased. By keeping L about the same, and by significantly reducing R, the multi-layered inductor structure is able to achieve a significantly higher Q factor.

The multi-layered inductor structure described above can be extended to any number of spiral inductors on any number of substrate layers, within physical limits. For practical considerations, the dimensions of the multi-layered inductor structure need to be such that the EM fields of the spiral inductors will overlap. It has been observed by Applicant that for a significant increase in Q to occur, the total thickness of all substrate layers should be a small percentage of the diameter of the spiral inductors. A total thickness to diameter ratio of 1:10 may be a practical goal for significant results.

Additional Layers

In addition to the substrate layers described above on which spiral inductors are situated, the multi-layered structure may further comprise some other layers, including but not limited to a tracing layer and a ground layer. In one embodiment, the tracing layer is the layer that electrically couples the center and tail portions of the spiral inductors (which act as the terminals of the overall inductor) to other circuit components. Thus, the tracing layer has conductive areas that receive and electrically couple to the vias 312 and 314, and one or more conductive traces or lines that electrically couple these conductive areas to one or more other circuit components. The tracing layer may also comprise the one or more other circuit components. In one embodiment, the tracing layer is placed beneath the last of the substrate layers on which a spiral inductor is situated, and is positioned such that: (a) it is substantially parallel with the other substrate layers; and (b) the conductive areas on the tracing layer are aligned with and electrically couple to the vias 312, 314. More will be said about the tracing layer in a later section.

The ground layer is the layer that provides a convenient ground for the components of the circuit of which the multi-layered inductor is a part. To serve its grounding purpose, the ground layer has a surface that is substantially covered with a conductive material. In one embodiment, the ground layer is placed beneath the tracing layer to serve as the bottom layer of the multi-layered structure, and is situated such that it is substantially parallel with the other layers. In one embodiment, to further improve the Q factor of the overall inductor, the ground layer may be implemented with one or more cutouts. More will be said about this in a later section.

Other Aspects for Improving Quality Factor

Low Loss Ground Return

Figure 4:
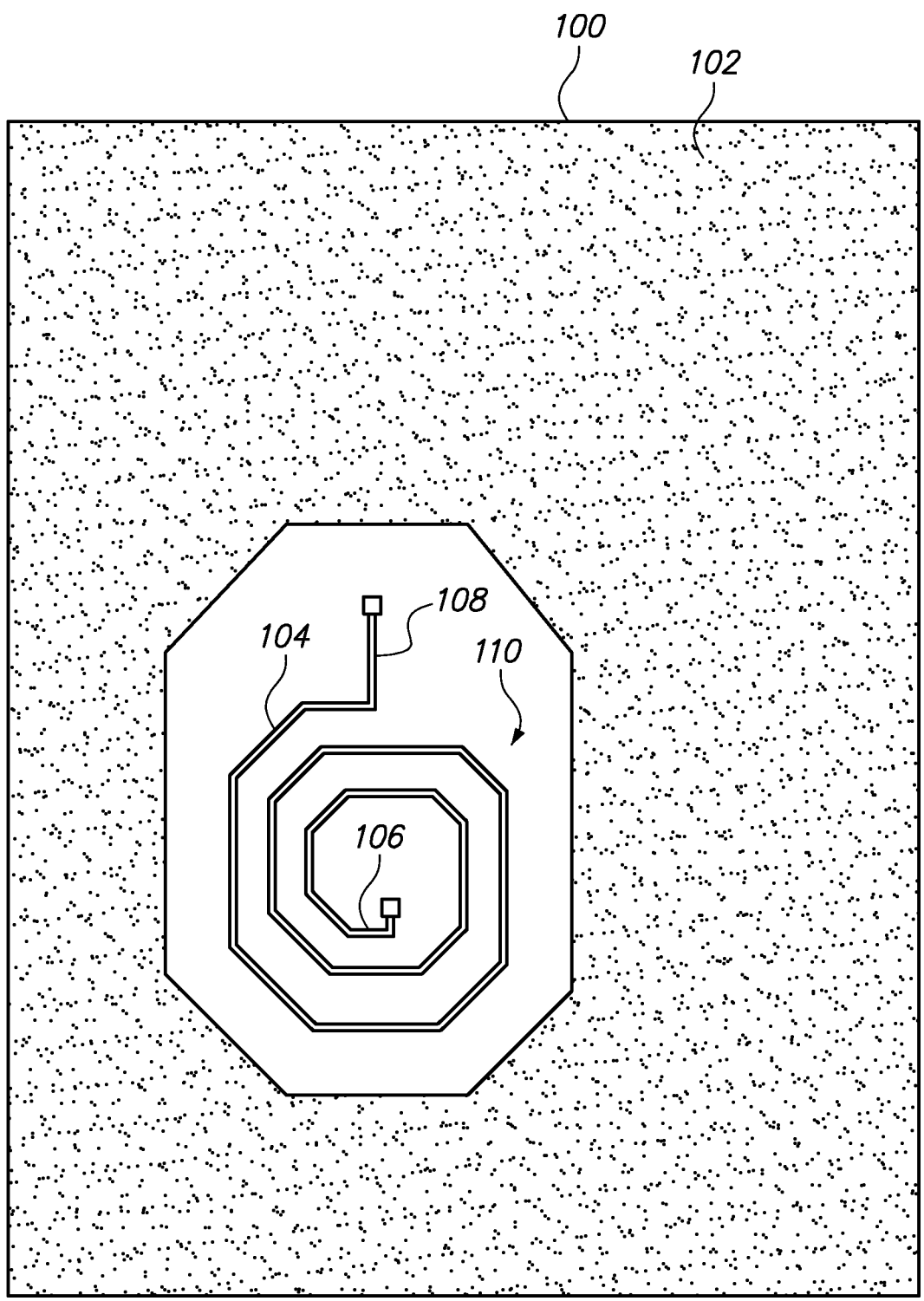
FIG. 4 shows the planar substrate layer of FIG. 1 with additional ground fill to provide a low loss ground return, in accordance with one embodiment of the present invention.
Figure 5:
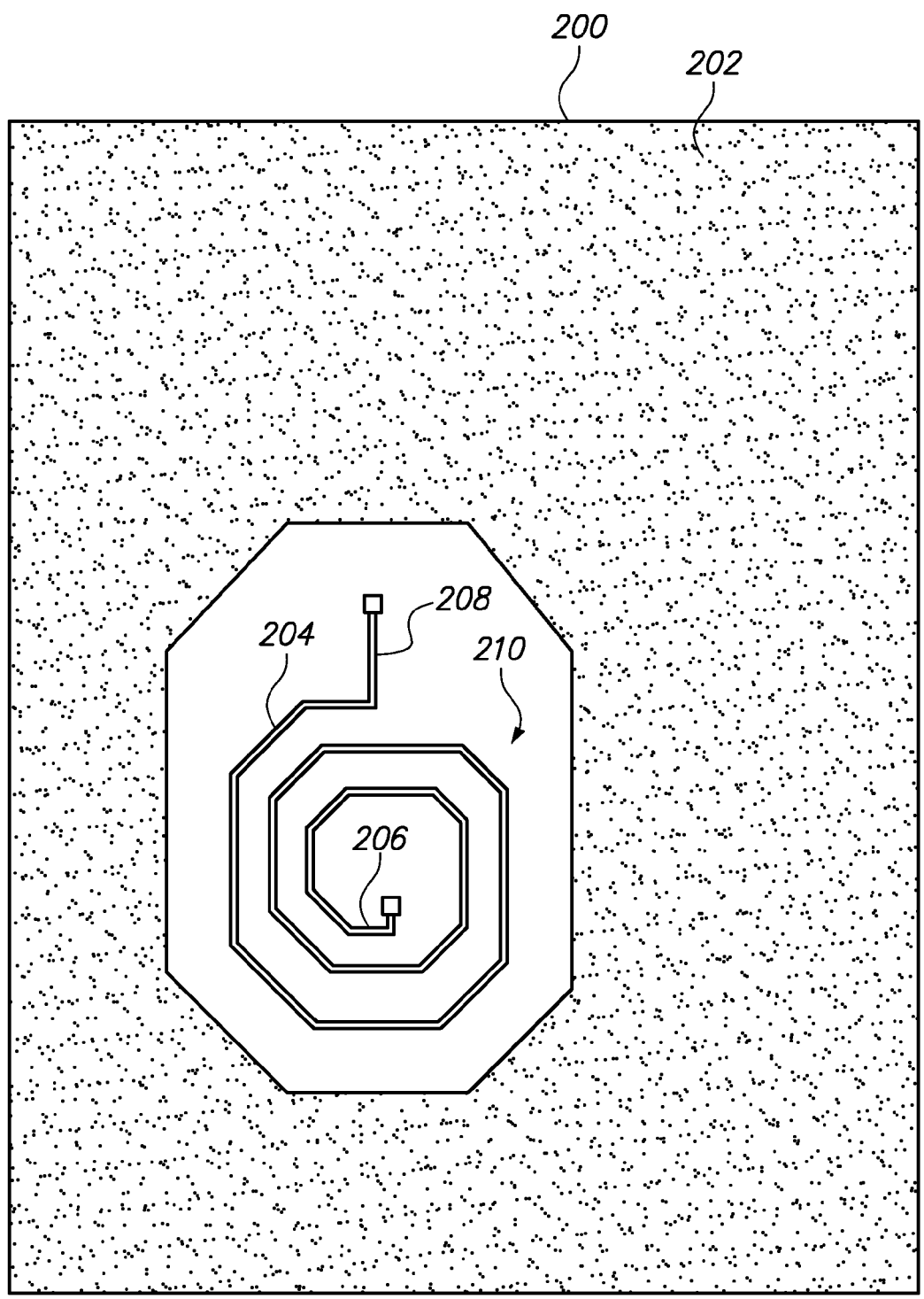
FIG. 5 shows the planar substrate layer of FIG. 2 with additional ground fill to provide a low loss ground return, in accordance with one embodiment of the present invention.

It has been observed by Applicant that skin effect losses are not the only losses that can significantly degrade the Q factor of the overall inductor. Other losses, such as losses through the substrate layers, may do so as well. To reduce such losses, one embodiment of the present invention provides easily reachable, low loss ground returns that can be exploited by the electromagnetic fields generated by the spiral inductors. In one embodiment, this is done by providing ground fill within proximity of one, some, or all of the spiral inductors. An example illustrating how this can be done is shown in FIG. 4. FIG. 4 basically shows the substrate layer 100 and the spiral inductor of FIG. 1. The only difference between FIGS. 1 and 4 is that in FIG. 4, a significant portion of the surface 102 that is within proximity of the spiral 110 is covered with a conductive material (as shown by the shading). This conductive material acts as a ground return for the electromagnetic fields generated by the spiral inductor. Notice that, because this ground return is on the same surface 102 of the substrate layer 100 as the spiral inductor, the electromagnetic fields generated by the spiral inductor can reach this ground return through air, which is a very low loss medium. If, instead, the ground return layer were on the opposite surface of the substrate layer 100, the electromagnetic fields would have to go through the substrate layer 100 to reach the ground return, which would cause more losses to be incurred, which in turn would degrade the Q factor of the spiral inductor and the overall multi-layered inductor. Thus, by implementing an easily reachable, low loss ground return in this manner, loss is decreased and the Q factor of the overall inductor is increased. This ground return may be implemented on one, some, or all of the substrate layers on which a spiral inductor is situated. Thus, the substrate layer 200 (FIG. 2) on which the second spiral inductor is implemented may also be enhanced with a low loss ground return, as shown in FIG. 5. In general, to maximize the Q factor of the multi-layered inductor structure, a low loss ground return should be implemented on each substrate layer on which a spiral inductor is situated, and the substrate layers should be made as thin as possible (e.g. as thin as 1 mil).

Cutout(s) in Ground Layer

As mentioned above, a ground layer may be implemented as part of the multi-layered structure to provide a convenient ground for the components of the circuit of which the multi-layered inductor is a part. Because this ground layer is covered with a conductive material, it provides a possible ground return for the electromagnetic fields generated by a spiral inductor. For example, suppose that the second spiral inductor shown in FIG. 5 is the last spiral inductor implemented in the multi-layered inductor. For the electromagnetic fields generated by this spiral inductor, there are at least two potential ground returns: (1) the low loss ground return provided by the conductive material on the surface 202 of substrate layer 200; and (2) the ground return provided by the ground layer. Because there are multiple potential ground returns, some portion of the electromagnetic fields generated by the second spiral inductor will return through the low loss ground return and some portion will return through the ground layer. Because the portion that returns through the ground layer has to go through two layers (substrate layer 200 and the tracing layer), that portion will suffer significantly greater losses than the portion that grounds through the low loss ground return. Thus, from a loss minimization standpoint, it is desirable to have as little of the electromagnetic fields return through the ground layer as possible.

In one embodiment, this is achieved by cutting away the portion of the ground layer that is beneath the spiral inductor. Put another way, the ground layer is implemented with a cutout portion that is aligned with the spiral 210 in such a way that the cutout is directly beneath the spiral 210. In one embodiment, the cutout is larger in area than the spiral 210. By implementing this cutout, the spiral inductor is caused to no longer sense (or at least to sense to a much lesser degree) the ground layer as a potential ground return path. Thus, more of the electromagnetic fields generated by the spiral inductor will return through the low loss ground return than the ground layer. This results in reduced losses and increased Q factor for the overall inductor.

From a practical standpoint, a benefit of having this cutout in the ground layer is that it causes the dielectric constant and the thicknesses of the substrate layers to have little effect on the overall inductance of the multi-layered inductor structure. As a result, variations in the manufacturing of the substrate layers (e.g. manufacturing tolerances) will have little effect on the performance of the multi-layered inductor structure.

Layer Capacitance

The multi-layered inductor described above may be used in almost any circuit in which an inductor is needed, including a low pass filter with tight stopband requirements. It has been observed by Applicant that parasitic inductances and capacitances in a low pass filter can cause the stopband of the filter to rise significantly. It has also been observed by Applicant that this rise in stopband may be offset at least in part by implementing a capacitance in parallel with one or more selected inductors in the low pass filter. If such a parallel capacitance is needed in connection with the multi-layered inductor described above, it can be implemented as a layer capacitance.

Figure 6:
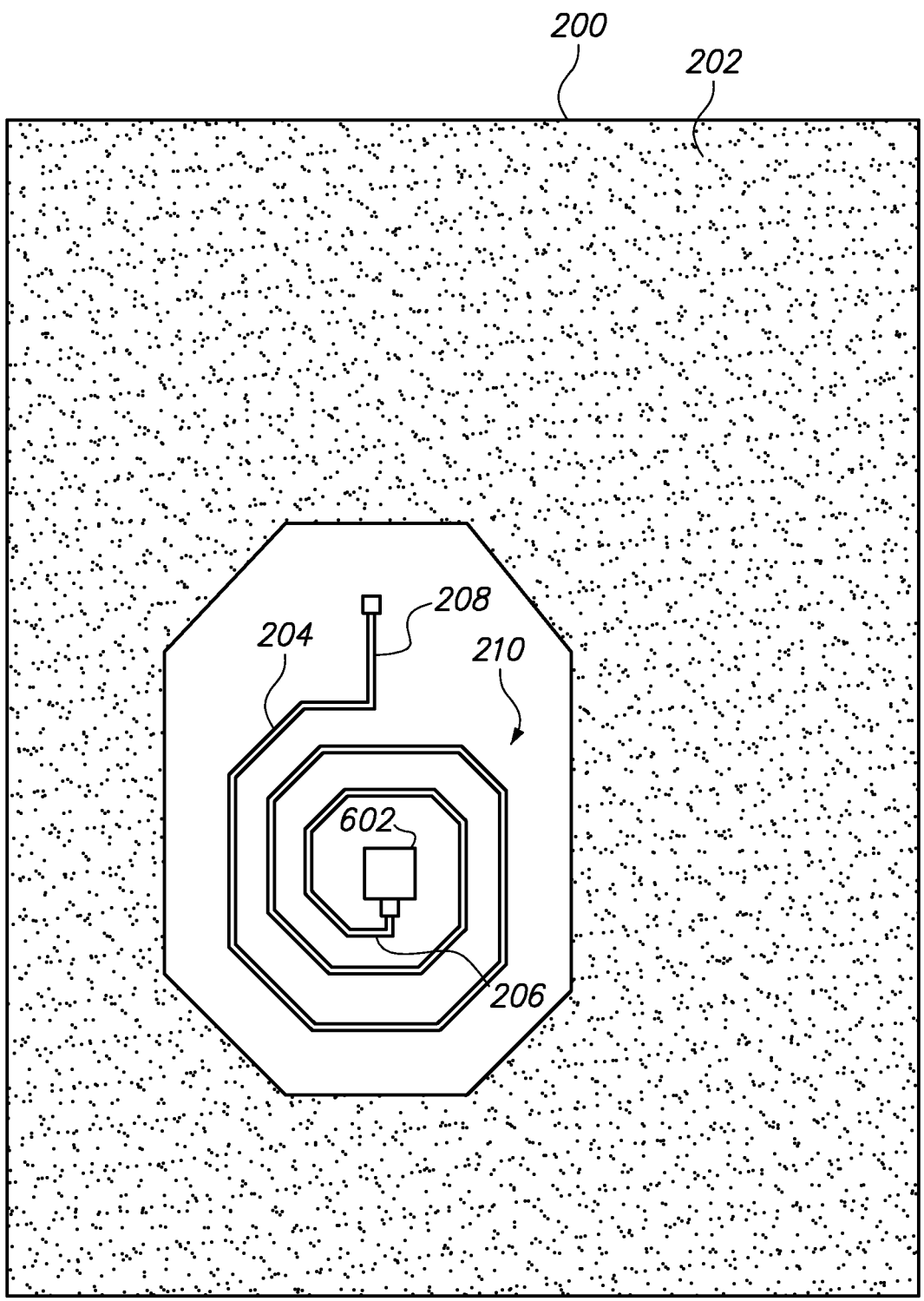
FIG. 6 shows the planar substrate layer of FIG. 5 with an additional patch of conductive material situated adjacent to and in electrical contact with the center portion of the spiral inductor, in accordance with one embodiment of the present invention.

To illustrate how a layer capacitance may be implemented in accordance with one embodiment of the present invention, reference will be made to FIGS. 6 and 7. FIG. 6 shows an updated version of the second spiral inductor shown in FIG. 5. The only difference between FIGS. 5 and 6 is that FIG. 6 shows an additional patch 602 of conductive material that is situated adjacent to and in electrical contact with the center portion 206 of the spiral 210 and the via 312. In the current example, it is assumed that the multi-layered inductor is implemented using only two layers of spiral inductors; thus, the layer below the second spiral inductor shown in FIG. 6 is the tracing layer.

Figure 7:
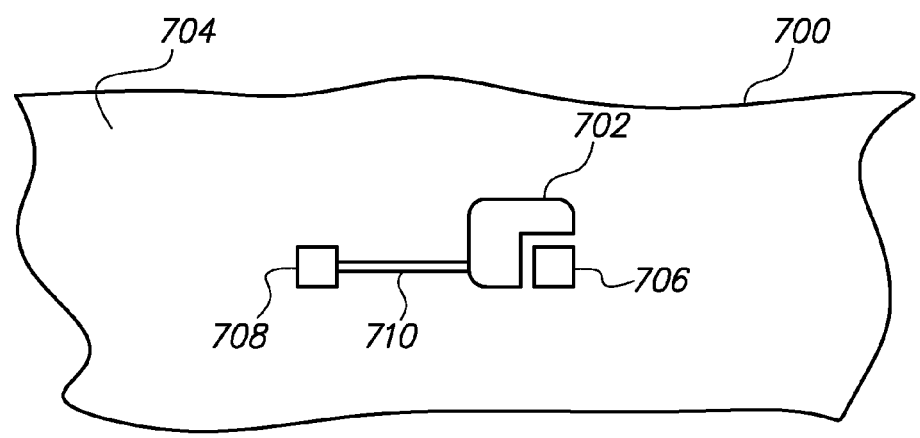
FIG. 7 shows a portion of a tracing layer to illustrate how a layer capacitance may be implemented with the multi-layered inductor structure, in accordance with one embodiment of the present invention.

FIG. 7 shows a portion of the tracing layer. As shown, the tracing layer 700 has a surface 704 on which several sets of conductive material are situated (for the sake of simplicity, no tracing lines connecting the overall inductor to other circuit components are shown). These sets of conductive material include a first area 706 of conductive material, a second area 708 of conductive material, a patch 702 of conductive material, and a strip 710 of conductive material. The patch 702 is situated within proximity of but is not electrically coupled to the first area 706. The patch 702 is electrically coupled to the second area 708 by the strip 710.

In one embodiment, the tracing layer 700 is placed beneath the substrate layer 200 of FIG. 6 and is situated relative to the substrate layer 200 such that: (a) the tracing layer 700 is substantially parallel with the second substrate layer 200; (b) the first area 706 of conductive material is substantially aligned with and is electrically coupled to via 312 (FIG. 3), thereby being electrically coupled to the center portion 206 of spiral 210; (c) the second area 708 of conductive material is substantially aligned with and is electrically coupled to via 314, thereby being electrically coupled to the tail portion 208 of spiral 210; and (d) the patch 702 of conductive material is substantially aligned with the patch 602 (see FIG. 6) of conductive material on the second substrate layer 200. Aligned in this manner, patch 602 will be directly above patch 702. Since the tracing layer 700 in the current example is directly below the second substrate layer 200, these two patches 602 and 702 will act as the two plates of a capacitor. With one patch 602 electrically coupled to via 312 and the other patch 702 electrically coupled to via 314, and since the vias are coupled to the terminals of the multi-layered inductor, this capacitor is effectively in parallel with the multi-layered inductor. In this manner, a layer capacitance may be implemented across the multi-layered inductor as part of the multi-layered structure. It has been observed by Applicant that this technique of implementing a layer capacitance across the multi-layered inductor works well to control the stopband of a low pass filter where the resonant frequencies are at least 1.5 times that of the cutoff frequency of the low pass filter.

Multi-Component Circuit Using Multi-Layered Structure

Thus far, for the sake of simplicity, only one spiral inductor has been shown on each planar substrate layer 100, 200 (FIGS. 5 and 6). It should be noted, however, that each substrate layer may have any desired number of spiral inductors situated thereon. The spiral inductors on a substrate layer may be electrically coupled to each other and/or to other circuit components (e.g. capacitors) by way of one or more conductive lines or strips to form an overall circuit. These electrical couplings will most likely be to the tail portions of the spiral inductors as the center portions are difficult to access due to their location in the middle of the spiral inductors. Circuit components that need to electrically couple to the center portions of the spiral inductors may do so, for example, by way of the tracing layer. By implementing multiple spiral inductors on multiple substrate layers, and by coupling the spiral inductors to each other and to other circuit components (e.g. by way of the conductive lines on the substrate layers, the vias, the tracing layer, etc.), an overall multi-layered, multi-component circuit can be constructed. Such a multi-layered circuit structure can be used to construct almost any desired circuit in which an inductor is implemented.

Figure 8:
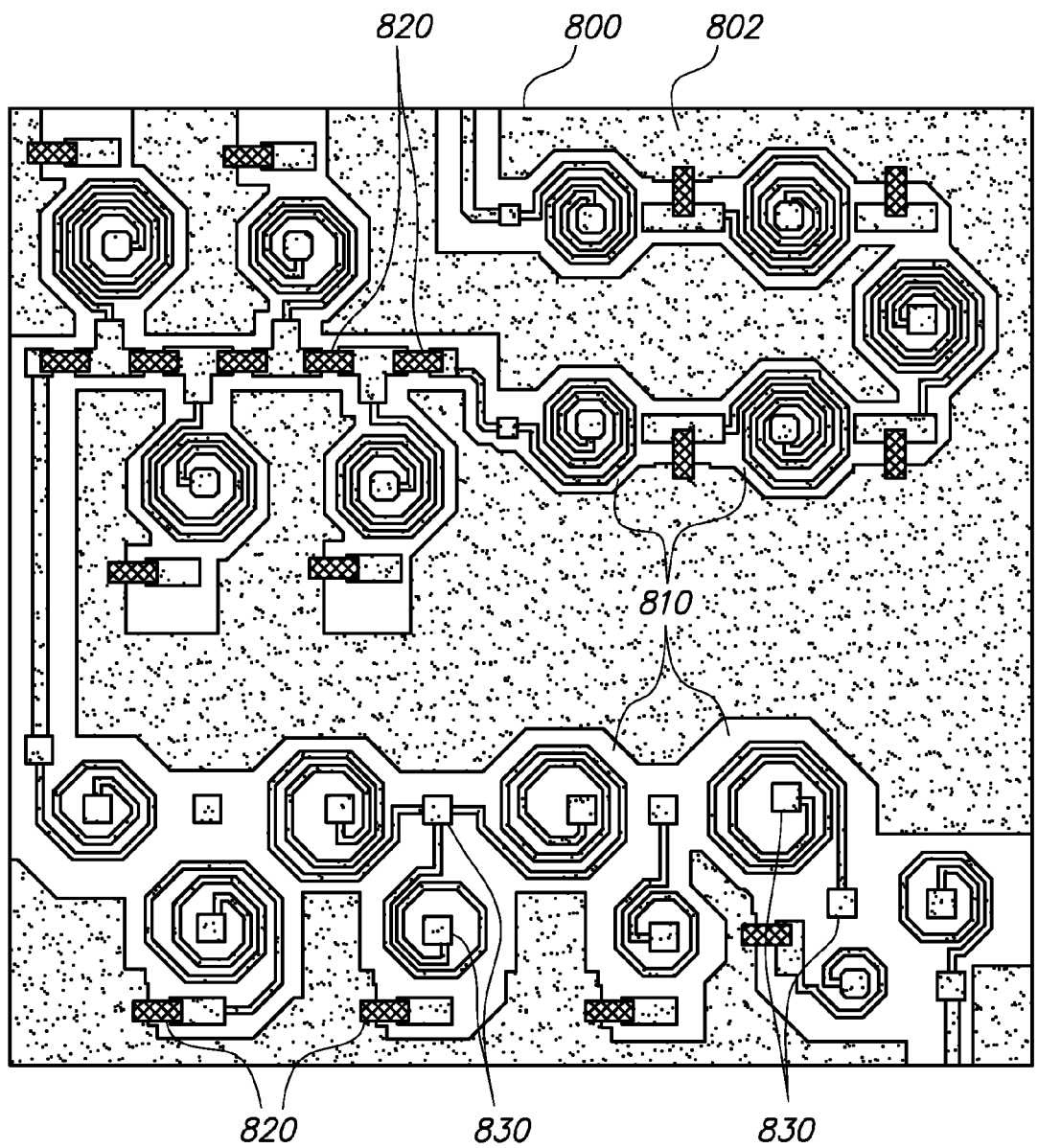
FIG. 8 shows the top substrate layer of a multi-layered diplexer circuit constructed in accordance with one embodiment of the present invention.

An example of a circuit that can be constructed using the multi-layered structure described above is a diplexer circuit. The top substrate layer of a sample diplexer circuit constructed in accordance with one embodiment of the present invention is shown in FIG. 8. As shown, the top substrate layer 800 of the diplexer circuit has a surface 802 on which a plurality of spiral inductors 810 are situated. The various spiral inductors 810 may have specifically designed geometries to achieve precise inductance values at precise frequencies. To form an overall circuit, some of the spiral inductors 810 may be electrically coupled to each other by way of conductive lines or strips. Some of the spiral inductors 810 may also/instead be coupled to other circuit components (e.g. capacitors 820). As shown in FIG. 8, each of the spiral inductors 810 has its center portion and its tail portion coupled to a corresponding via 830. As explained in a previous section, these vias 830 couple the spiral inductors 810 to corresponding spiral inductors on other substrate layers, as well as to the tracing layer. Some of the components shown in FIG. 8 may be coupled to the center portion of some of the spiral inductors 810 by way of the tracing layer. To provide the low loss ground return discussed in a previous section, the surface 802 of the top substrate layer 800 may be substantially covered by a conductive material (as shown by the shading).

FIG. 8 shows the top substrate layer of the sample diplexer circuit. In one embodiment, the diplexer circuit further comprises one or more additional substrate layers on which additional spiral inductors are situated. For the sake of example, it will be assumed that the diplexer circuit comprises only two spiral inductor layers (i.e. the top substrate layer 800 and a second substrate layer on which spiral inductors are situated). However, it should be noted that any number of spiral inductor layers may be implemented.

In one embodiment, the second substrate layer has substantially the same spiral inductor arrangement as that shown in FIG. 8. More specifically, in one embodiment, for each spiral inductor 810 on the top substrate layer 800, there is a corresponding spiral inductor on the second substrate layer; thus, there is a one-to-one correspondence (note: this one-to-one correspondence is not required; if so desired, there may be one or more spiral inductors on the top substrate layer 800 that do not have corresponding spiral inductors on the second substrate layer and vice versa). In one embodiment, each pair of corresponding spiral inductors is geometrically similar. Thus, if a spiral inductor 810 on the top substrate layer 800 were placed over its corresponding spiral inductor on the second substrate layer, the spiral inductor 810 on the top substrate layer would substantially overlap the spiral inductor on the second substrate layer. Also, each pair of corresponding spiral inductors is aligned with each other. Thus, when the second substrate layer is positioned such that it is substantially parallel to the top substrate layer 800 and is properly aligned, each spiral inductor 810 on the top substrate layer 800 will substantially overlap its corresponding spiral inductor on the second substrate layer. In this manner, the plurality of spiral inductors 810 on the top substrate layer 800 are effectively placed in parallel with their corresponding spiral inductors on the second substrate layer. To enable each pair of corresponding spiral inductors to act as a single overall inductor, each pair is electrically coupled. In one embodiment, the center portions of a pair of corresponding spiral inductors are electrically coupled to each other by a first via, and the tail portions of the corresponding spiral inductors are electrically coupled to each other by a second via. To provide the low loss ground return discussed in a previous section, the surface of the second substrate layer may also be substantially covered by a conductive material in a manner similar to that of the top substrate layer 800.

In addition to the top and second substrate layers, the diplexer circuit may further comprise a tracing layer. As noted above, the tracing layer couples to the vias that connect the multiple layers of spiral inductors, and provides a layer that allows the various overall inductors to be coupled to each other and to other circuit components. If it is desired to implement a layer capacitance across any of the multi-layered inductors, the tracing layer and the second substrate layer may be enhanced in the manner described previously in connection with FIGS. 6 and 7.

The diplexer circuit may further comprise a ground layer. As described in a previous section, the ground layer may include one or more cutouts. In one embodiment, for the sample diplexer circuit being discussed, the ground layer has a plurality of cutouts, one for each of the spiral inductors on the second substrate layer. Each cutout is aligned with its corresponding spiral inductor such that when the ground layer is placed beneath and substantially in parallel with the second substrate layer, each cutout is directly beneath its corresponding spiral inductor. These cutouts help to reduce losses, which in turn, help to increase the Q factor of the multi-layered inductors.

In the manner described, a multi-layered diplexer circuit may be constructed in accordance with one embodiment of the present invention. Many other circuits may be constructed in a similar manner.

Ultra Low Loss, Shielded Structure

Figure 9:
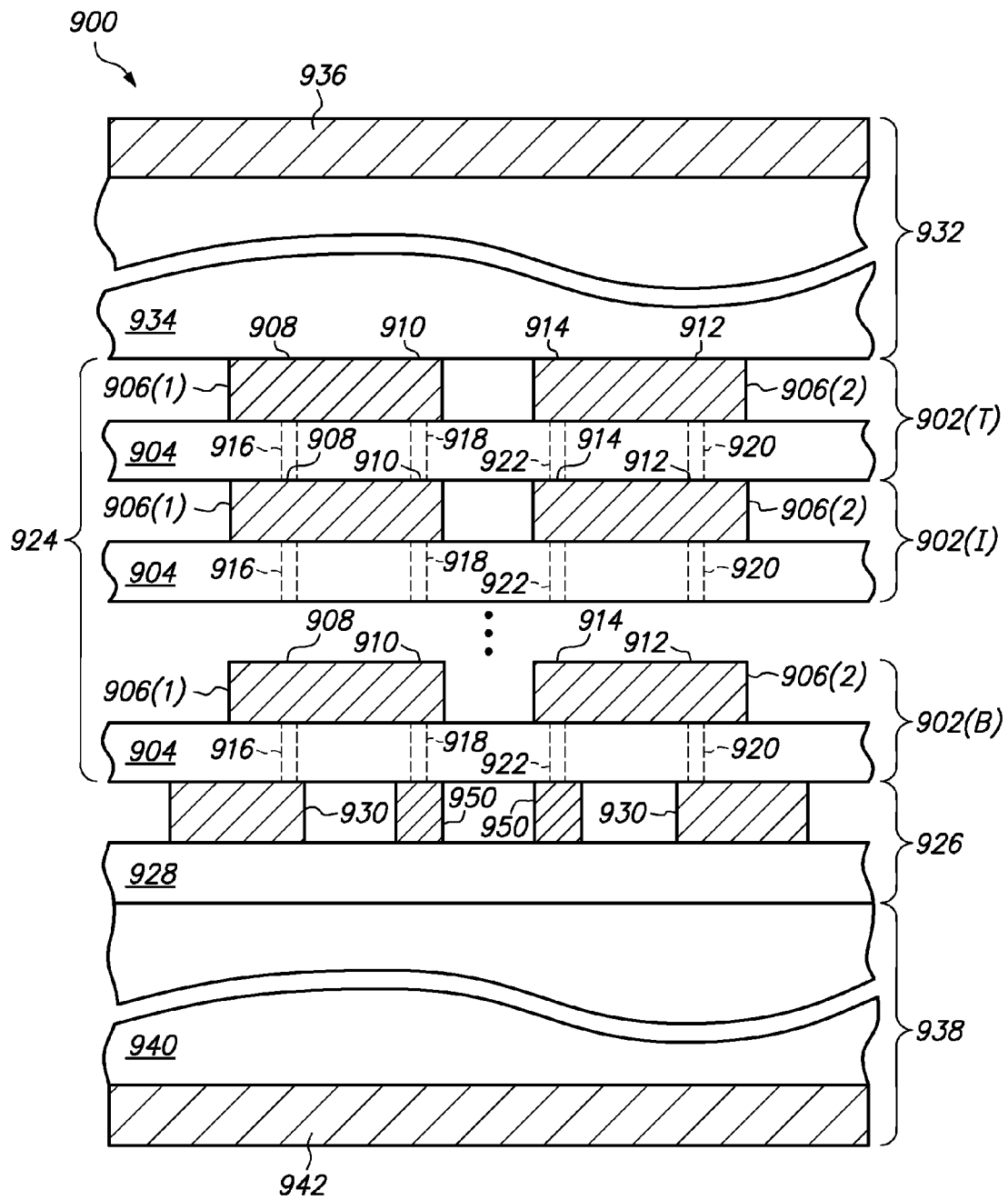
FIG. 9 shows a side view of an enhanced multi-layered structure, in accordance with one embodiment of the present invention.

For some high performance applications, such as some diplexer and triplexer circuits operating at certain high frequencies, an ultra low loss, high Q inductor structure is needed. For such applications, an enhanced multi-layered structure may be used. An example of such an enhanced multi-layered structure is shown in FIG. 9. While this enhanced structure is well suited for high performance applications, it should be noted that it may be used for other applications as well, including any application in which one or more inductors are needed.

FIG. 9 depicts a side view of an enhanced multi-layered structure 900, in accordance with one embodiment of the present invention. As shown, the enhanced structure 900 comprises an N number of inductor layers 902 (note: 902(T), 902(I), and 902(B) are all subsets of 902). N is an integer greater than one (in one embodiment, N is three or greater). Each inductor layer 902 may comprise a substrate 904 and one or more spiral inductors 906 situated on a planar surface of that substrate 904 (note: 906(1) and 906(2) are subsets of 906). For the sake of illustration, FIG. 9 shows a first spiral inductor 906(1) and a second spiral inductor 906(2) on each substrate 904 of each inductor layer 902; however, it should be noted that each inductor layer 902 may have any desired number of spiral inductors. The two spiral inductors 906(1), 906(2) on each inductor layer 902 may or may not be electrically coupled to each other, and may be part of an overall larger circuit.

In one embodiment, each of the spiral inductors 906 on the various inductor layers 902 may be formed in the manner described previously. For example, each spiral inductor 906 may be formed by a line or strip of conductive material (e.g. copper, etc.) that is situated on the planar surface of a corresponding substrate 904, and the line or strip (having a certain width) may wind outwardly from and around a point on the surface of the substrate 904 in such a way that a spiral is formed on the substrate 904 (as described previously in connection with FIGS. 1 and 2). Formed in this manner, each spiral inductor 906 has a center portion and a tail portion. Thus, as shown in FIG. 9, each of the first spiral inductors 906(1) on each of the inductor layers 902 has a center portion 908 and a tail portion 910, and each of the second spiral inductors 906(2) on each of the inductor layers 902 has a center portion 912 and a tail portion 914.

In one embodiment, the N inductor layers 902 are stacked one upon another to form an overall stack 924 of inductor layers. In one embodiment, each substrate 904 is a planar substrate; thus, the inductor layers 902 may be stacked one upon another by positioning the substrates 904 in such a manner that they are substantially parallel with each other, and by placing a substrate 904 onto the spiral inductors 906 (1), 906(2) of the inductor layer 902 below it. Constructed in this manner, the stack 924 will have a top inductor layer 902(T), a bottom inductor layer 902 (B), and zero or more intermediate inductor layers 902(I) between the top and bottom inductor layers.

In one embodiment, when the inductor layers 902 are stacked, the first spiral inductors 906(1) on the various inductor layers 902 are aligned with each other, and the second spiral inductors 906(2) on the various inductor layers 902 are aligned with each other. In one embodiment, the first spiral inductors 906(1) are aligned with each other such that the electromagnetic field generated by each of the first spiral inductors 906(1) overlaps, at least partially, with the electromagnetic field generated by at least one other of the first spiral inductors 906(1) on another inductor layer 902. Likewise, the second spiral inductors 906(2) are aligned with each other such that the electromagnetic field generated by each of the second spiral inductors 906(2) overlaps, at least partially, with the electromagnetic field generated by at least one other of the second spiral inductors 906(2) on another inductor layer 902. In one embodiment, this field alignment may be achieved by: (a) physically aligning the first spiral inductors 906(1) such that one is physically above and/or below another; and (b) physically aligning the second spiral inductors 906(2) such that one is physically above and/or below another. It should be noted that physical alignment may not be required. Field alignment may be achieved even if precise physical alignment is not achieved.

With the various inductor layers 902 stacked and aligned, the first spiral inductors 906(1) on the various inductors layers 902 may be interconnected, and the second spiral inductors 906(2) on the various inductors layers 902 may be interconnected. As shown in FIG. 9, a coupling structure 916 (which, for example, may be a via) electrically couples all of the center portions 908 of all of the first spiral inductors 906(1) to each other, and another coupling structure 918 (which, for example, may also be a via) electrically couples all of the tail portions 910 of all of the first spiral inductors 906(1) to each other. Coupled in this manner, all of the first spiral inductors 906(1) on the various inductor layers 902 may operate as a single overall inductor. Also, as shown in FIG. 9, a coupling structure 920 (which, for example, may be a via) electrically couples all of the center portions 912 of all of the second spiral inductors 906(2) to each other, and another coupling structure 922 (which, for example, may also be a via) electrically couples all of the tail portions 914 of all of the second spiral inductors 906(2) to each other. Coupled in this manner, all of the second spiral inductors 906(2) on the various inductor layers 902 may operate as a single overall inductor. Field aligned and coupled in the manner described above, the electromagnetic fields generated by the first spiral inductors 906 (1) will overlap and reinforce each other, and the electromagnetic fields generated by the second spiral inductors 906(2) will overlap and reinforce each other. This leads to a higher inductance value and hence a higher Q factor for the overall inductor formed by the first spiral inductors 906(1) and the overall inductor formed by the second spiral inductors 906 (2).

In one embodiment, the substrate 904 of one or more of the inductor layers 902 may be very thin, and in fact, may have a thickness substantially less than typical printed circuit board or silicon layers. For example, the thickness of the substrate 904 may be less than 1 mil (in one embodiment, the thickness of the substrate 904 is approximately 0.5 mils). These and even smaller thicknesses may be used, if so desired. As a point of comparison, the thickness of the conductive material that forms the spiral inductors 906 is typically between 0.7 mils and 1.2 mils. In one embodiment, the substrate 904 of the top inductor layer 902(T) and the substrate 904 of each intermediate inductor layer 902(I) may be very thin. The substrate 904 of the bottom inductor layer 902(B) may be very thin as well; however, since there is no inductor layer below the bottom inductor layer 902(B), the thickness of this substrate is not as significant. Having a thin substrate 904 for the inductor layers 902 may give rise to a number of benefits.

A first benefit is reduced substrate loss. As noted above, the electromagnetic field generated by a spiral inductor 906 on one inductor layer 902 overlaps with the electromagnetic field generated by another spiral inductor 906 on another inductor layer 902. To do so, the electromagnetic field passes through at least one of the substrates 904. When it does so, the electromagnetic field suffers some substrate loss. With a thinner substrate 904, this loss is reduced.

Another benefit of a thinner substrate 904 is that it enables the overall thickness of the stack 924 to be reduced, which makes it possible for the electromagnetic field generated by a spiral inductor 906 to overlap with the electromagnetic fields generated by more of the other spiral inductors 906. As an example, in a stack of three, four, or even more inductor layers 902, if the substrates 904 are made thin enough, the electromagnetic field generated by the first spiral inductor 906(1) on the top inductor layer 902(T) may overlap, at least partially, with the electromagnetic fields generated by all of the other first spiral inductors 906(1) on all of the other inductor layers 902, including the electromagnetic field generated by the first spiral inductor 906(1) on the bottom inductor layer 902 (B). This greater field overlap increases the inductance of the overall inductor formed by the first spiral inductors 906(1) (the same would be true for the overall inductor formed by the second spiral inductors 906(2)). This increased inductance helps to further increase the Q factors of these two overall inductors.

Yet another benefit of a thinner substrate is reduced skin effect losses. As discussed previously in connection with equations 4 and 5, skin effect loss (expressed as a resistance R in the equations), may be reduced by coupling more spiral inductors in parallel. With thinner substrates 904, more inductor layers 902 may be added; hence, more spiral inductors may be coupled in parallel. This serves to reduce the resistance R of the overall inductor formed by the first spiral inductors 906(1) and the overall inductor formed by the second spiral inductors 906(2), which helps to further increase the Q factors of these two overall inductors.

The benefits described above, and other potential benefits, may be derived by having thin substrates 904 for the inductor layers 902. For purposes of the present invention, any type of material (e.g. dielectric material, silicon, or any other material suitable for electronic circuits) may be used for the substrates 904. For some materials, given current manufacturing capabilities, it may be difficult to achieve a thickness of less than 3 or 4 mils, much less 1 mil. Thus, in one embodiment, a buried capacitance material, that can be made very thin (using special resin or ferrite materials and new manufacturing techniques), and that is typically used to provide high capacitance between a ground plane and a power plane, is used for the substrates 904 of the inductor layers 902. Examples of this type of material include, but are not limited to, Dupont AP8515, 3M ECM, and FaradFlex BC8. At first glance, the use of a high capacitance material for the substrates 904 may seem to run counter to the objectives of the multi-layered structure 900. However, because the first spiral inductors 906(1) on the various inductor layers 902 are electrically coupled to each other, and the second spiral inductors 906(2) on the various inductor layers 902 are electrically coupled to each other (which prevents the spiral inductors on the various inductors layers from storing any charge relative to each other), the higher capacitance of the substrates 904 is not appreciably felt by the spiral inductors 906(1), 906(2). Thus, the buried capacitance material may be used without experiencing any appreciable adverse effects. At this point, it should be noted that the buried capacitance material is provided only as an example of a material that may be used for the substrates 904 of the inductor layers 902. Other types of material may be used as well, if so desired, and all such types of material are within the scope of the present invention.

In one embodiment, one or more (perhaps even all) of the substrates 904 of the inductor layers 902 may have a significant portion of its surface covered with a conductive material to provide a low loss ground return for the spiral inductors 906. The manner in which this may be done was described previously in connection with FIGS. 4 and 5. With this low loss ground return, losses can be further reduced, and Q factor can be further increased.

In addition to the stack 924, the multi-layered structure 900 may further include a tracing layer 926. As discussed previously, a tracing layer is a layer that may be used to electrically couple the center and tail portions of spiral inductors to other circuit components and perhaps to each other to form an overall, larger circuit. In one embodiment, the tracing layer 926 comprises a substrate 928 and conductive areas 930, 950 situated on the substrate 928 that receive and electrically couple to the coupling structures 916, 918, 920, 922. Some of the conductive areas 930 may extend into traces or lines that electrically couple these conductive areas to each other and/or to one or more other circuit components. The tracing layer 926 may further include other traces or lines that are not shown, and may comprise one or more non spiral inductor circuit components. Furthermore, the tracing layer 926 may include structures for implementing one or more layer capacitances in the manner described previously in connection with FIGS. 6 and 7. If such a layer capacitance is implemented, the structures 702, 706, 708, 710 may be implemented on the tracing layer 926, and the additional patch 602 may be implemented on the substrate 904 of the bottom inductor layer 902(B) such that the additional patch 602 is situated adjacent to and in electrical contact with one of the spiral inductors 906 on the bottom inductor layer 902(B). Overall, the tracing layer 926 provides some of the connectivity needed to form an overall circuit that includes the spiral inductors 906. In one embodiment, the tracing layer 926 is placed beneath the bottom inductor layer 902(B), and is positioned such that: (a) it is substantially parallel with the inductor layers 902; and (b) the conductive areas on the tracing layer 926 are aligned with and electrically couple to the coupling structures 916, 918, 920, 922.

In addition to the layers already mentioned, the multi-layered structure 900 may further comprise a first ground layer 932 and a second ground layer 938. In one embodiment, the first ground layer 932 comprises a substrate 934 and a layer of conductive material 936 covering a substantial portion of a planar surface of the substrate 934. This layer of conductive material 936 (which may, for example, be copper or some other conductive material) acts as a ground plane for the spiral inductors 906 and other circuit elements. Like the first ground layer 932, the second ground layer 938 may also comprise a substrate 940 and a layer of conductive material 942 covering a substantial portion (or even all) of a planar surface of the substrate 940. This layer of conductive material 942 (which may, for example, be copper or some other conductive material) also acts as a ground plane for the spiral inductors 906 and other circuit elements.

In one embodiment, the first ground layer 932 is disposed above the top inductor layer 902(T) of the stack 924, and the second ground layer 938 is disposed below the tracing layer 926, which itself is below the bottom inductor layer 902(B) of the stack 924. Arranged in this manner, the stack 924 of inductor layers 902 and the tracing layer 926 are "sandwiched" between the ground layers 932, 938. By sandwiching the stack 924 and the tracing layer 926 in this way, the ground layers 932, 938 provide shielding for the stack 924 and the tracing layer 926. This shielding helps to further reduce losses suffered by the spiral inductors 906, which in turn helps to further increase the Q factors of the overall inductor formed by the first spiral inductors 906(1) and the overall inductor formed by the second spiral inductors 906 (2). This shielding may eliminate the need to implement/use other more bulky and costly types of shielding for the stack 924 and the tracing layer 926.

In one embodiment, the substrates 934, 940 of the ground layers 932, 938 are significantly thicker than the substrates 904 of the inductor layers 902. For example, substrates 934, 940 may each have a thickness greater than 15 mils; in one embodiment, the substrates 934, 940 have a thickness of approximately 20 mils. Because of this, relatively few of the electromagnetic fields generated by the spiral inductors 906 will actually ground through the first and second ground layers 932, 938 (instead, most of the electromagnetic fields will ground through the low loss ground return provided on the surface of one or more of the substrates 904 of the inductor layers 902). As a result, substrate losses caused by grounding through the first and second ground layers 932, 938 will be kept relatively small. For purposes of the present invention, any type of material (e.g. dielectric material, silicon, or any other material suitable for electronic circuits) may be used for the substrates 934, 940. To minimize substrate losses, a low loss substrate material (e.g. PTFE Teflon, RO4000 series of materials from Rogers Corporation, etc.) may be used for substrates 934, 940.

In determining how thick to make the substrates 934, 940, several factors may be taken into account. On the one hand, having a thicker substrate 934, 940 may be advantageous in that it gives rise to less parasitic capacitance to ground. On the other hand, a thicker substrate 934, 940 may provide less inductor return path coupling to ground. Also, a thicker substrate 934, 940 gives rise to a wider gap between the conductive layers 936, 942 and the spiral inductors 906, which may allow more noise to enter the structure 900 near the edges of the structure (thereby, reducing the effectiveness of the shielding provided by the ground layers 932, 938). Given that there are positives and negatives to having thicker substrates 934, 940, the selection of a thickness for the substrates 934, 940 may involve some trade-offs. Thus, the thicknesses selected for substrates 934, 940 for a particular implementation may depend upon what factors are more important for that implementation.

Because the first ground layer 932, in the embodiment shown in FIG. 9, is disposed on top of the top inductor layer 902(T), it may not be possible or practical to implement or include other circuit elements (e.g. capacitors) on the top inductor layer 902(T). If such other circuit elements are needed/desired, they may be added to the surface of the substrate 934 of the first ground layer 932. In one embodiment, the layer of conductive material 936 on the first ground layer 932 need not cover the entire surface of the first ground layer's substrate 934. Rather, portions of the substrate surface may be left uncovered by the conductive layer 936 to accommodate other circuit elements. These circuit elements may be coupled to the spiral inductors 906 and/or the tracing layer 926 by way of coupling structures (not shown) that pass through the substrate 934 of the first ground layer 932 (these coupling structures may, for example, be one or more vias). Thus, the first ground layer 932 may be used to implement one or more portions of a circuit. The second ground layer 938 may also be used in a similar fashion, if so desired.

Figure 10:
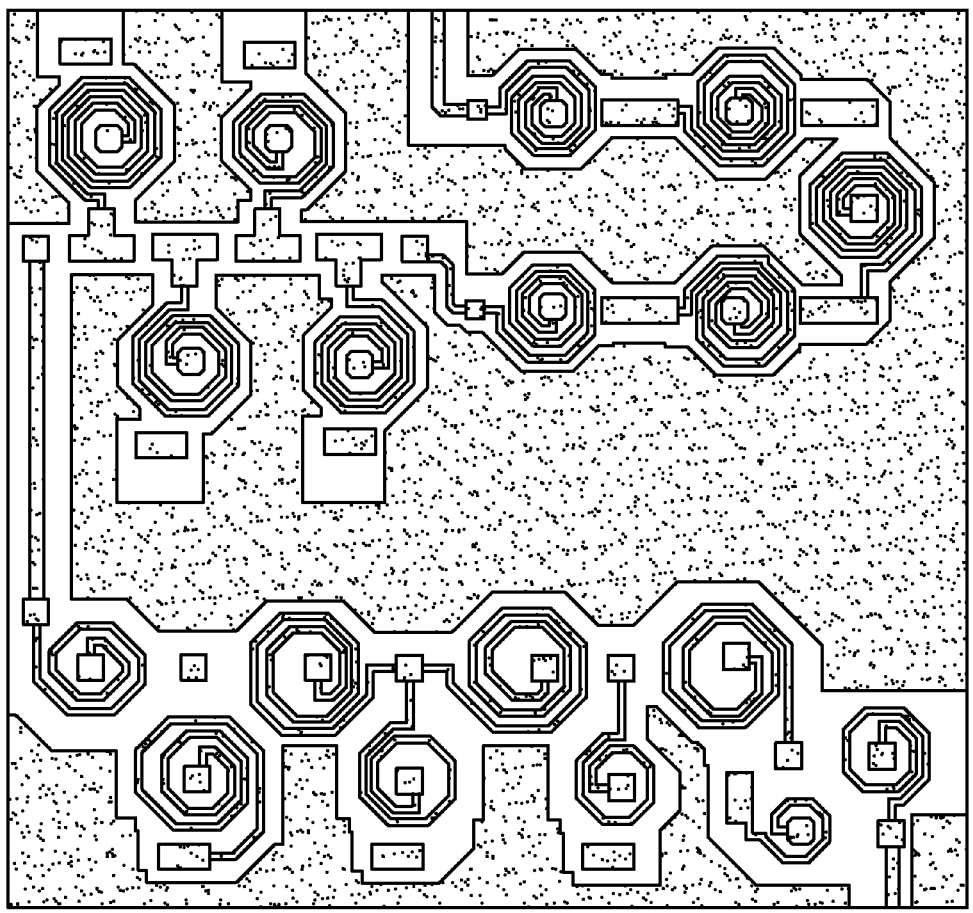
FIG. 10 shows the spiral inductor pattern of FIG. 8 with the non spiral inductor circuit elements removed.
Figure 11:
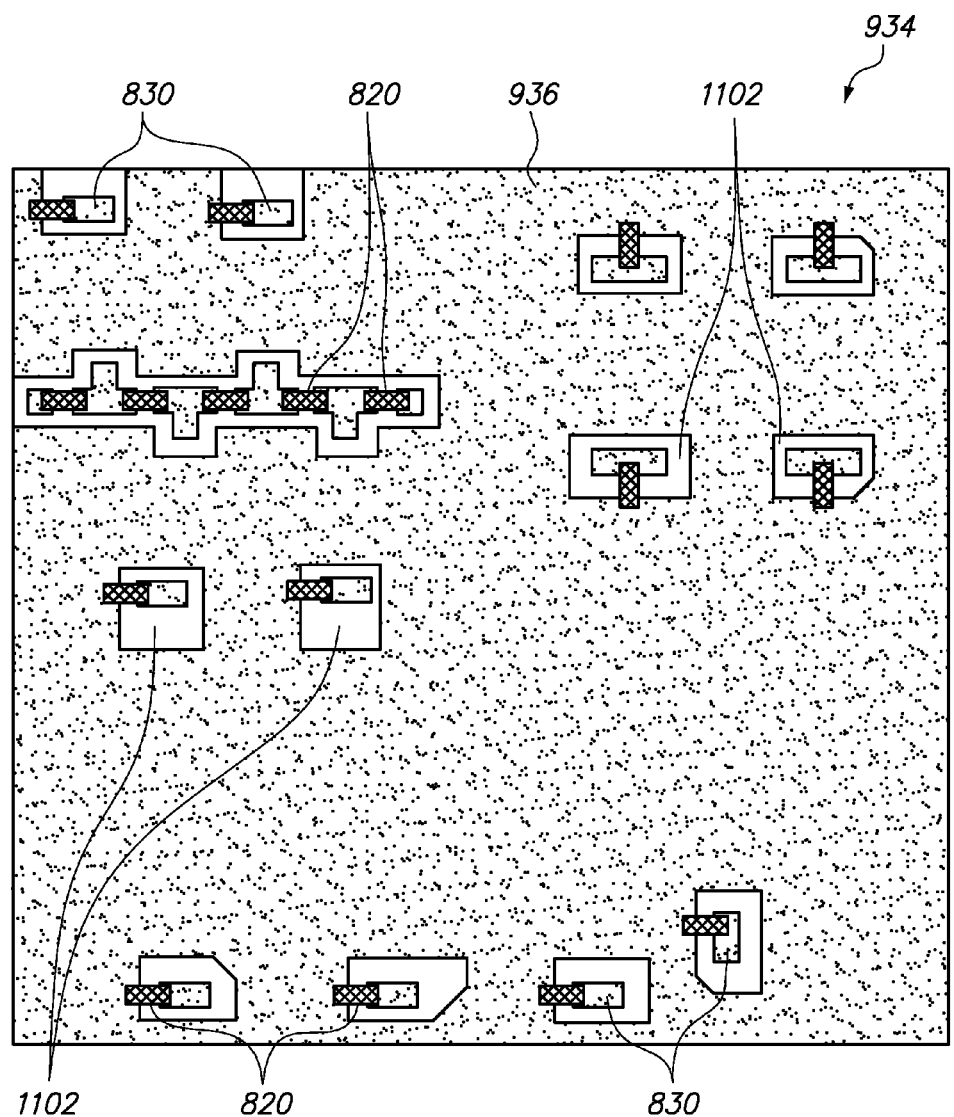
FIG. 11 shows the non spiral inductor circuit elements of FIG. 8 situated on a surface of a ground layer, in accordance with one embodiment of the present invention.

To illustrate how the first ground layer 932 may be used in conjunction with the inductor layers 902 to implement an overall circuit, reference will be made to the examples shown in FIGS. 10 and 11. FIG. 10 basically shows the same spiral inductor pattern as that shown in FIG. 8, which was previously discussed as being the top layer of a sample diplexer circuit. The difference between the two drawings is that FIG. 10 does not include the non spiral inductor circuit components, such as the capacitors 820. The spiral inductor pattern shown in FIG. 10 may be implemented on the surface of each of the substrates 904 of the inductor layers 902 of FIG. 9. Assuming that the inductor layers 902 are properly aligned, and that the proper coupling structures are used to electrically couple the various spiral inductors on the various inductor layers 902 to each other and to the tracing layer 926, the spiral inductor portions of the circuit are implemented by the inductor layers 902 and the tracing layer 926.

To complete the circuit, the non spiral inductor circuit components (e.g. the capacitors 820) of FIG. 8 may be implemented on the surface of the substrate 934 of the first ground layer 932. This is shown in FIG. 11, where the surface of the substrate 934 is depicted. As shown, there are bare portions 1102 (shown in white) of the surface that are not covered by the conductive layer 936 (shown with a stipple pattern). These bare portions 1102 may be used to accommodate the non spiral inductor components (e.g. the capacitors 820). These bare portions 1102 may also be used to separate the conductive layer 936 (which acts as a ground plane) from the coupling structures 830 (e.g. vias) that couple to the spiral inductors and the tracing layer below. As shown in FIG. 11, each terminal of a capacitor 820 that needs to be coupled to ground is coupled to the conductive layer 936. Each terminal of a capacitor 820 that needs to be coupled to something other than ground (for example, to one of the spiral inductors or to the tracing layer) is coupled to a coupling structure 830, which in turn is coupled (through the substrate 934) to a corresponding spiral inductor or a corresponding portion of the tracing layer below. In this manner, the surface of the substrate 934 of the first ground layer 932 may be used in conjunction with the inductor layers 902 and the tracing layer 926 to implement an overall circuit. Using this structure 900, any circuit that involves one or more inductors may be implemented, including high performance circuits that call for ultra low loss, high Q inductors.

At this point, it should be noted that although the invention has been described with reference to specific embodiments, it should not be construed to be so limited. Various modifications may be made by those of ordinary skill in the art with the benefit of this disclosure without departing from the spirit of the invention. Thus, the invention should not be limited by the specific embodiments used to illustrate it but only by the scope of the issued claims.

What is claimed is:

1. A multi-layered structure, comprising:
a set of N inductor layers, where N is an integer greater than one, each inductor layer comprising a substrate and a first spiral inductor situated on a surface of that substrate, the first spiral inductor on each inductor layer having a center portion and a tail portion, the N inductor layers being stacked one directly upon another to form a stack having a top inductor layer, zero or more intermediate inductor layers, and a bottom inductor layer, the first spiral inductors on the N inductor layers being aligned with each other such that an electromagnetic field generated by each first spiral inductor overlaps, at least partially, with an electromagnetic field generated by at least one other first spiral inductor on another inductor layer;
a first coupling structure electrically coupling the center portions of all of the first spiral inductors on the N inductor layers to each other;
a second coupling structure electrically coupling the tail portions of all of the first spiral inductors on the N inductor layers to each other;
a first ground layer comprising a first substrate and a first layer of conductive material covering a substantial portion of a surface of the first substrate, the first ground layer being disposed above the top inductor layer of the stack and the first substrate having a first thickness; and
a second ground layer comprising a second substrate and a second layer of conductive material covering a substantial portion of a surface of the second substrate, the second ground layer being disposed below the bottom inductor layer and the second substrate having a second thickness;
wherein the first thickness of the first substrate and the second thickness of the second substrate are selected to cause the first and second layers of conductive material to be sufficiently close to the set of N inductor layers to provide shielding for the set of N inductor layers, but yet sufficiently far from the set of N inductor layers so that relatively few of the electromagnetic fields generated by the first spiral inductors will actually ground through the first and second layers of conductive material.

2. The multi-layered structure of claim 1, wherein the N inductor layers include a particular inductor layer comprising a particular substrate and a particular first spiral inductor situated on a surface of the particular substrate, wherein the particular first spiral inductor is implemented as a strip of conductive material that is situated on the surface of the particular substrate, and wherein the strip of conductive material winds outwardly from and around a point on the surface of the particular substrate to form a spiral on the surface of the particular substrate.

3. The multi-layered structure of claim 1, wherein N is three or greater.

4. The multi-layered structure of claim 1, wherein the electromagnetic field generated by each first spiral inductor overlaps, at least partially, with the electromagnetic field generated by each of the other first spiral inductors.

5. The multi-layered structure of claim 1, wherein the substrate of at least one of the inductor layers has a thickness of less than one mil, where a mil is one thousandth of an inch.

6. The multi-layered structure of claim 1, wherein the substrate of the top inductor layer and the substrate of each intermediate inductor layer has a thickness of less than one mil, where a mil is one thousandth of an inch.

7. The multi-layered structure of claim 5, wherein the first thickness of the first substrate of the first ground layer is greater than fifteen mils.

8. The multi-layered structure of claim 7, wherein the second thickness of the second substrate of the second ground layer is greater than fifteen mils.

9. The multi-layered structure of claim 1, wherein all of the first spiral inductors on the N inductor layers operate as a single overall inductor.

10. The multi-layered structure of claim 1, wherein the N inductor layers include a particular inductor layer comprising a particular substrate and a particular first spiral inductor situated on a particular surface of the particular substrate, and wherein at least a substantial portion of the particular surface that is within proximity of the particular first spiral inductor is covered with a conductive material, which acts as a ground return for the electromagnetic field generated by the particular first spiral inductor.

11. The multi-layered structure of claim 1, wherein each of the N inductor layers further comprises a second spiral inductor situated on the surface of the substrate corresponding to that inductor layer, wherein each second spiral inductor has a center portion and a tail portion, and wherein the second spiral inductors on the N inductor layers are aligned with each other such that an electromagnetic field generated by each second spiral inductor overlaps, at least partially, with an electromagnetic field generated by at least one other second spiral inductor on another inductor layer.

12. The multi-layered structure of claim 11, further comprising:
a third coupling structure electrically coupling the center portions of all of the second spiral inductors on the N inductor layers to each other; and
a fourth coupling structure electrically coupling the tail portions of all of the second spiral inductors on the N inductor layers to each other.

13. The multi-layered structure of claim 12, wherein the first ground layer further comprises a circuit element situated on a portion of the surface of the first substrate that is not covered by the first layer of conductive material, and wherein the circuit element is electrically coupled to at least one of the first spiral inductor and the second spiral inductor on the top inductor layer.

14. The multi-layered structure of claim 13, further comprising a fifth coupling structure that passes through the first substrate, wherein the fifth coupling structure electrically couples the circuit element situated on the portion of the surface of the first substrate to at least one of the first spiral inductor and the second spiral inductor on the top inductor layer.

15. The multi-layered structure of claim 1, wherein the first substrate, the second substrate, and the substrate of at least one of the inductor layers in the set of N inductor layers, have: (a) substantially equal lengths; and (b) substantially equal widths.

16. A multi-layered structure, comprising:
a set of N inductor layers, where N is an integer greater than one, each inductor layer comprising a substrate and a first spiral inductor situated on a surface of that substrate, the first spiral inductor on each inductor layer having a center portion and a tail portion, the N inductor layers being stacked one upon another to form a stack having a top inductor layer, zero or more intermediate inductor layers, and a bottom inductor layer, the first spiral inductors on the N inductor layers being aligned with each other such that an electromagnetic field generated by each first spiral inductor overlaps, at least partially, with an electromagnetic field generated by at least one other first spiral inductor on another inductor layer;
a first coupling structure electrically coupling the center portions of all of the first spiral inductors on the N inductor layers to each other;
a second coupling structure electrically coupling the tail portions of all of the first spiral inductors on the N inductor layers to each other;
a first ground layer comprising a first substrate and a first layer of conductive material covering a substantial portion of a surface of the first substrate, the first ground layer being disposed above the top inductor layer of the stack; and a second ground layer comprising a second substrate and a second layer of conductive material covering a substantial portion of a surface of the second substrate, the second ground layer being disposed below the bottom inductor layer;

wherein the bottom inductor layer has a particular surface on which a particular first spiral inductor is situated, wherein the particular first spiral inductor has a center portion and a tail portion, wherein the particular surface further has a first patch of conductive material situated thereon that is adjacent to and is in electrical contact with the center portion of the particular first spiral conductor, and wherein the multi-layered structure further comprises:

a tracing layer having a tracing surface, wherein the tracing surface has a first area of conductive material, a second area of conductive material, a second patch of conductive material, and a strip of conductive material situated thereon, wherein the strip of conductive material electrically couples the second area of conductive material to the second patch of conductive material, wherein the second patch of conductive material is situated within proximity of but not in electrical contact with the first area of conductive material, and wherein the tracing layer is positioned such that: (a) the tracing layer is between the bottom inductor layer and the second ground layer, and is substantially parallel with the bottom inductor layer and the second ground layer; (b) the first area of conductive material is substantially aligned with and is electrically coupled to the first coupling structure; (c) the second area of conductive material is substantially aligned with and is electrically coupled to the second coupling structure; and (d) the first patch of conductive material is substantially aligned with the second patch of conductive material such that the first patch of conductive material and the second patch of conductive material act as a capacitor.

17. A multi-layered structure, comprising:

a set of N inductor layers, where N is an integer greater than one, each inductor layer comprising a substrate and a first spiral inductor situated on a surface of that substrate, the first spiral inductor on each inductor layer having a center portion and a tail portion, the N inductor layers being stacked one upon another to form a stack, the first spiral inductors on the N inductor layers being aligned with each other such that an electromagnetic field generated by each first spiral inductor overlaps, at least partially, with an electromagnetic field generated by at least one other first spiral inductor on another inductor layer;

a first coupling structure electrically coupling the center portions of all of the first spiral inductors on the N inductor layers to each other; and a second coupling structure electrically coupling the tail portions of all of the first spiral inductors on the N inductor layers to each other;

wherein the set of N inductor layers comprises a particular inductor layer, wherein the particular inductor layer has a particular surface on which a particular first spiral inductor is situated, wherein the particular first spiral inductor has a center portion and a tail portion, wherein the particular surface further has a first patch of conductive material situated thereon that is adjacent to and is in electrical contact with the center portion of the particular first spiral conductor, and wherein the multi-layered structure further comprises:

a tracing layer having a tracing surface, wherein the tracing surface has a first area of conductive material, a second area of conductive material, a second patch of conductive material, and a strip of conductive material situated thereon, wherein the strip of conductive material electrically couples the second area of conductive material to the second patch of conductive material, wherein the second patch of conductive material is situated within proximity of but not in electrical contact with the first area of conductive material, and wherein the tracing layer is positioned such that: (a) the tracing layer is substantially parallel with the particular inductor layer; (b) the first area of conductive material is substantially aligned with and is electrically coupled to the first coupling structure; (c) the second area of conductive material is substantially aligned with and is electrically coupled to the second coupling structure; and (d) the first patch of conductive material is substantially aligned with the second patch of conductive material such that the first patch of conductive material and the second patch of conductive material act as a capacitor.

18. The multi-layered structure of claim 17, wherein the particular first spiral inductor is implemented as a strip of conductive material that is situated on the particular surface, and wherein the strip of conductive material winds outwardly from and around a point on the particular surface to form a spiral on the particular surface.

19. The multi-layered structure of claim 17, wherein N is three or greater.

20. The multi-layered structure of claim 17, wherein the electromagnetic field generated by each first spiral inductor overlaps, at least partially, with the electromagnetic field generated by each of the other first spiral inductors.

21. The multi-layered structure of claim 17, wherein the substrate of at least one of the inductor layers has a thickness of less than one mil, where a mil is one thousandth of an inch.

22. The multi-layered structure of claim 17, wherein all of the first spiral inductors on the N inductor layers operate as a single overall inductor.

23. The multi-layered structure of claim 17, wherein the set of N inductor layers comprises a certain inductor layer having a certain surface on which a certain first spiral inductor is situated, and wherein at least a substantial portion of the certain surface that is within proximity of the certain first spiral inductor is covered with a conductive material, which acts as a ground return for the electromagnetic field generated by the certain first spiral inductor.

* * * * *